United States Patent
Singh et al.

(10) Patent No.: US 7,767,584 B1
(45) Date of Patent: Aug. 3, 2010

(54) IN-SITU PRE-COATING OF PLASMA ETCH CHAMBER FOR IMPROVED PRODUCTIVITY AND CHAMBER CONDITION CONTROL

(75) Inventors: Harmeet Singh, Berkeley, CA (US); Saurabh J. Ullal, Berkeley, CA (US); Shibu Gangadharan, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 11/684,084

(22) Filed: Mar. 9, 2007

Related U.S. Application Data

(60) Division of application No. 10/607,293, filed on Jun. 25, 2003, now Pat. No. 7,204,913, which is a continuation-in-part of application No. 10/186,917, filed on Jun. 28, 2002, now Pat. No. 6,776,851.

(51) Int. Cl.
*H01L 21/302* (2006.01)
(52) U.S. Cl. .................. 438/706; 438/710; 438/712; 438/714; 438/719; 438/905; 134/1.1; 134/2; 134/31; 216/67
(58) Field of Classification Search .................. 438/706, 438/710, 712, 714, 719, 905; 134/1.1, 2, 134/31; 216/67
See application file for complete search history.

(56) References Cited

U.S. PATENT DOCUMENTS

| | | | | |
|---|---|---|---|---|
| 5,356,478 A | * | 10/1994 | Chen et al. | 134/1 |
| 5,647,953 A | * | 7/1997 | Williams et al. | 134/1.1 |
| 6,071,573 A | * | 6/2000 | Koemtzopoulos et al. | 427/578 |
| 6,164,295 A | * | 12/2000 | Ui et al. | 134/1.1 |
| 6,379,575 B1 | * | 4/2002 | Yin et al. | 216/67 |
| 6,635,185 B2 | * | 10/2003 | Demmin et al. | 216/64 |
| 6,872,322 B1 | * | 3/2005 | Chow et al. | 216/67 |
| 2003/0013314 A1 | * | 1/2003 | Ying et al. | 438/710 |
| 2004/0011385 A1 | * | 1/2004 | Henderson et al. | 134/22.18 |

* cited by examiner

*Primary Examiner*—Nadine Norton
*Assistant Examiner*—Maki Angadi
(74) *Attorney, Agent, or Firm*—Martine Penilla & Gencarella, LLP

(57) ABSTRACT

A method for providing substantially similar chamber condition before each wafer process operation in a semiconductor process chamber is provided. The method allows for prevention of transport of particle and metal contamination from chamber surfaces to the processed wafer. The method initiates with depositing a silicon containing layer over an inner surface of an empty semiconductor process chamber. Then, a wafer is introduced into the semiconductor process chamber after depositing the silicon containing layer. Next, a process operation is performed on the wafer. The process operation deposits a residue on the silicon containing layer. Next, an in-situ cleaning process is initiated upon completion of the processing operation and removal of the wafer. The process initiation includes flowing a fluorine containing gas into the semiconductor process chamber, and establishing a pressure within the semiconductor process chamber capable of allowing a plasma created from the fluorine containing gas to clear the silicon containing layer covering the inner surface of the processing chamber. A semiconductor processing chamber having a silicon containing pre-coat is also provided.

7 Claims, 10 Drawing Sheets

IN-SITU PRE-COATING OF PLASMA ETCH CHAMBER FOR IMPROVED PRODUCTIVITY AND CHAMBER CONDITION CONTROL

CROSS REFERENCE TO RELATED APPLICATIONS

This application is a divisional application of application Ser. No. 10/607,293, now U.S. Pat. No. 7,204,913, filed on Jun. 25, 2003 which is a continuation-in-part of application Ser. No. 10/186,917 now U.S. Pat. No. 6,776,851, filed on Jun. 28, 2002. The disclosure of these applications are incorporated herein by reference for all purposes.

BACKGROUND OF THE INVENTION

1. Field of the Invention

This invention generally relates to an apparatus and method of cleaning a processing chamber to remove previously deposited chamber residues, which have accumulated on interior surfaces of the apparatus. In particular, the invention relates to a silicon-containing coating being applied to the inner surfaces of a processing chamber where the silicon-containing coating is removed along with any residues deposited on the coating during processing operations.

2. Description of the Related Art

As semiconductor processes deal with smaller geometries being defined on semiconductor substrates it is becoming more difficult to maintain the uniformity and accuracy of critical dimensions. Moreover, it has become increasingly important that the environment inside the processing chamber be consistent to ensure acceptable wafer to wafer variability of the critical dimensions. As is known in the art, many of the processes carried out within the semiconductor processing chambers leave deposits on the inner surfaces of the processing chamber. As these deposits accumulate over time, they can become a source of particulate contamination that is harmful to the substrates being processed. For example, the particulate contamination may flake off and fall onto the surface of the substrate if the particulate contamination is allowed to build up over time.

Although care and caution is involved during the monitoring of a chemical process, more often than not, undesired residues are deposited on the inner surfaces of the process chambers where the processes are taking place. The undesired residues, unfortunately, get deposited in and around the walls of the processing chamber. The build up of residues inside the processing chamber, over time, not only make the processes unreliable and shifted from baseline, but also result in degraded, defective substrates due to particulate contamination that builds up over time on the inner surfaces of the chamber. Without frequent cleaning procedures, impurities from the residue deposited on the chamber's inner surfaces can migrate onto the substrate. In addition, process etch rates or deposition rates can vary over time due to the changing chamber conditions from residue build-up resulting in out of control process performance. As alluded to above, the build up of deposits on the inner surfaces of the chamber causes an inconsistent environment which impacts the processing operation being performed. That is, the build up of deposits increases with each processing operation. Thus, each successive processing operation does not initiate with the same chamber conditions. Accordingly, the changed starting conditions for each successive processing operation causes a variance that eventually exceeds acceptable limits, which results in etch rate drift, critical dimension drift, profile drift, etc.

One attempt to solve these issues has been to run in-situ cleaning processes in between processing operations. However, these cleaning processes tend to leave residues of their own behind. Thus, as a result of attempting to clean the processing chamber of one contaminant, the cleaning process leaves behind another residue that may build up over time and eventually flake off onto a semiconductor substrate. In addition, failure to completely clean the etch chamber affects the processing of the next semiconductor substrate. That is, the reproducibility and repeatability of the etch rate from wafer to wafer is gradually impacted such that the processing chamber will have to be wet cleaned in order to perform processing within acceptable limits. Thus, the system availability is adversely impacted because of the restricted mean time between wet cleans.

FIG. 1 is a simplified cross-sectional view of an etch chamber. Etch chamber 100 includes RF coil 102 disposed over window 104. A semiconductor substrate 106 to be processed rests on substrate support 108. In between each process operation, a wafer-less auto clean (WAC) process can be performed in order to minimize buildup of residues on the inner surface of etch chamber 100. However, it has been observed that the WAC process itself leaves particulates or residues 110, on the inner surfaces of chamber 100. As more residue 110 accumulates on the inner surfaces, the impact on the processing operation, such as an etch operation, becomes more severe because of the residue buildup.

Eventually a wet clean operation must be performed to remove residues that are not entirely removed by the in-situ cleaning process or residues left behind by the cleaning process. Unfortunately, such cleaning operations affect a substrate processing system's utilization in a variety of ways. For example, system utilization is reduced by the time involved in performing cleaning operations. When a wet clean is performed, opening the processing chamber and physically wiping the chamber's interior surfaces results in even more downtime because the processing environment must subsequently be re-stabilized. Moreover, the re-stabilization of the chamber condition requires processing many wafers to condition the chamber back to the pre-wet clean operating chamber state without excessive residue build-up.

In view of the foregoing, what is needed is a method and apparatus for in-situ cleaning and chamber condition control, so that the chamber state is the same for every wafer being processed, thereby allowing for reproducible and repeatable process operations for each successive wafer and extending the mean time between wet cleans. The chamber condition control method ensures repeatable process operations despite the possible slow buildup of residues due to etch and clean operations in the process chamber.

SUMMARY OF TILE INVENTION

Broadly speaking, the present invention fills these needs by providing a method and apparatus for in-situ cleaning of a process chamber that provides a removable coating to the inner surfaces of the process chamber. The removable coating, known as pre-coat, allows for consistent starting conditions for each wafer being processed. It should be appreciated that the present invention may be implemented in numerous ways, including as an apparatus, a system, a device, or a method. Several inventive embodiments of the present invention are described below.

In one embodiment, a method for removing chamber deposits and chamber condition control in between process operations in a semiconductor process chamber is provided. The method initiates with depositing a silicon-containing pre-coat layer over an inner surface of a semiconductor process chamber. The semiconductor chamber is empty for the deposition of the silicon-containing layer. Then, a wafer is introduced into the semiconductor process chamber after depositing the silicon containing pre-coat layer. Next, a process operation is performed on the wafer. The process operation deposits a residue on the silicon containing layer covering the inner surface of the semiconductor process chamber. Then, the wafer is removed from the semiconductor process chamber. Next, an in-situ cleaning process is initiated upon completion of the processing operation and removal of the wafer. The initiating includes flowing a fluorine containing gas into the semiconductor process chamber, and establishing a pressure within the semiconductor process chamber capable of allowing a plasma created from the fluorine containing gas to clear the silicon containing layer covering the inner surface of the processing chamber.

In another embodiment, a method for cleaning a process chamber to provide substantially similar starting conditions for each process operation is provided. The method initiates with depositing a silicon containing pre-coat over the inner surfaces of the process chamber. Then, a wafer is introduced into the process chamber. Then, a process operation is performed on the wafer. Next, a $CF_x$ residue is deposited on silicon coated inner surfaces of the process chamber as part of the process operation. Then, the wafer is removed from the process chamber. Next, an oxygen plasma cleaning operation is performed to remove the $CF_x$ residue deposited from the process operation.

In yet another embodiment, a semiconductor processing chamber is provided. The semiconductor processing chamber includes a top electrode in communication with a power supply and a processing chamber defined within a base, a sidewall extending from the base, and a top disposed on the sidewall. The processing chamber having an outlet enabling removal of fluids within the processing chamber. The processing chamber includes a substrate support and an inner surface defined by the base, the sidewall and the top. The inner surface is coated with a removable silicon containing coating. The silicon containing coating is configured to seal particles between the inner surface and the silicon containing coating.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

An invention is described which provides a method and apparatus for providing the same starting conditions for the plasma processing of each wafer in a series of wafers. The same starting conditions are provided by applying a carbon-containing polymer coating or silicon-containing coating to the inner surfaces of the plasma processing chamber prior to introduction of the wafer. The pre-coat layer applied on the inner surfaces of the chamber also prevents the transfer of particulate and metal contamination from chamber surfaces to the subsequent wafer processed in the semiconductor reactor. It will be obvious, however, to one skilled in the art, that the present invention may be practiced without some or all of these specific details. In other instances, well known process operations have not been described in detail in order not to obscure the present invention.

The embodiments of the present invention provide a method and apparatus for applying a carbon and fluorine ($CF_x$) containing polymer or silicon-containing pre-coat that allows for the efficient removal of the pre-coat and residues deposited on the pre-coat during wafer processing operations. The $CF_x$ polymer coating is configured to include a plasma cleaning agent that is liberated upon a wafer-less auto clean (WAC) process performed on the chamber after a processing step. In one embodiment, the polymer coating includes a fluorine containing polymer wherein the fluorine is liberated during the cleaning process to remove the residues deposited from the cleaning process. In another embodiment, the polymer coating has an average chemical formula of $CF_x$, where x is a real number between 0 and 4.

The pre-coat provides a baseline starting condition that is repeated for each wafer being processed. Accordingly, process repeatability is ensured from wafer to wafer, thereby resulting in substantial elimination of variation caused by incrementally changing starting conditions experienced by each successive wafer. It should be appreciated that the material composition of the chamber is irrelevant when the pre-coat is applied to the inner surfaces of the chamber. While the embodiments described below are discussed with reference to silicon etching, such as shallow trench isolation (STI) and polysilicon gate etching, the embodiments may be applied to other suitable etching and deposition processes used in semiconductor fabrication processes. The details for applying a silicon based pre-coat are discussed with references to FIGS. 9-12 and Table 3.

Figure 1:
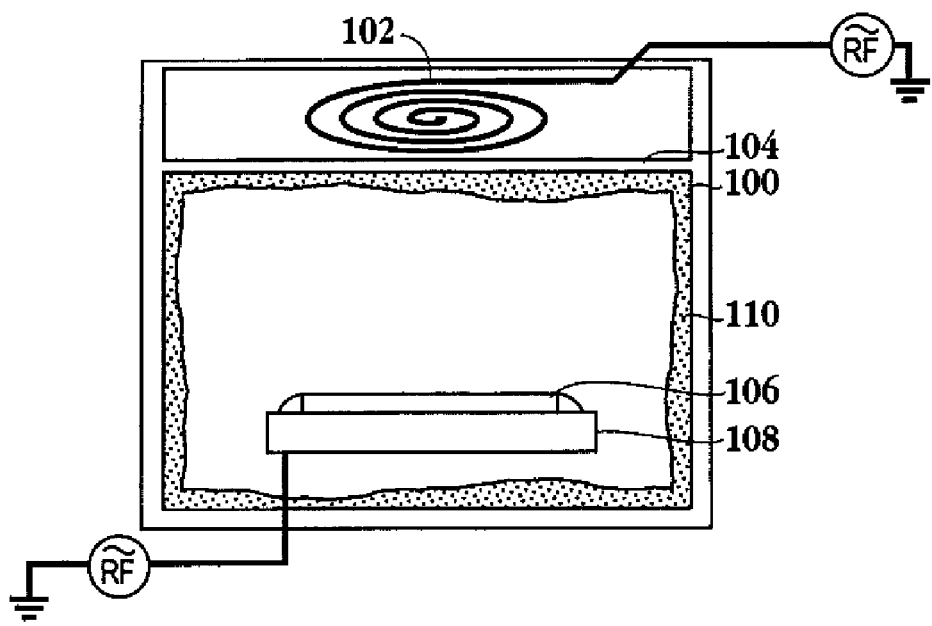
FIG. 1 is a simplified cross-sectional view of an etch chamber.
Figure 2:
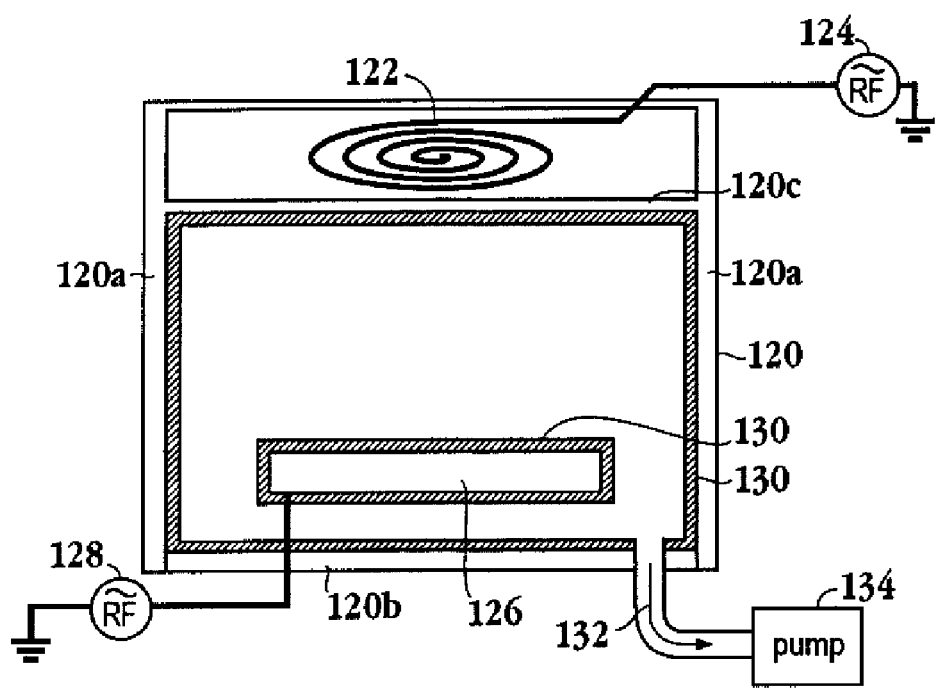
FIG. 2 is a cross-sectional schematic diagram of a semiconductor processing chamber having a coating applied to the inner surfaces of the chamber in accordance with one embodiment of the invention.

FIG. 2 is a cross-sectional schematic diagram of a semiconductor processing chamber having a pre-coat applied to the inner surfaces of the chamber in accordance with one embodiment of the invention. Processing chamber 120 is defined by top 120c, base 120b, and sidewall 120a extending between the top and the base. In one embodiment top 120c is a quartz or sapphire window. Electrode 122 is disposed above top 120c and provides the energy to create a plasma in processing chamber 120. Radio frequency (RF) supply 124 is in communication with electrode 122 and supplies the necessary power to the electrode for a processing operation in processing chamber 120. For example, processing chamber 120 can be used for etch or deposition processes commonly performed in semiconductor fabrication processes. Electrostatic chuck 126 is configured to support a wafer undergoing a processing operation. RF supply 128 supplies power to electrostatic chuck 126. Outlet 132 enables the evacuation of processing chamber 120 through pump 134.

Still referring to FIG. 2, pre-coat layer 130 is deposited on the inner surface of top 120c, base 120b, and sidewall 120a of processing chamber 120. Additionally, pre-coat layer 130 is deposited on the outer surface of electrostatic chuck 126. Thus, all the inner surfaces of processing chamber 120 are covered with pre-coat layer 130. In one embodiment, pre-coat layer 130 is composed of a carbon and fluorine containing polymer having an average formula $CF_x$, where x is a real number between 0 and 4. That is, polymer layer 130 includes the elements of carbon and fluorine. As will be explained in more detail below, polymer layer 130 is deposited on the inner surfaces of processing chamber 120 through the creation of a perfluorocarbon feed gas plasma in the processing chamber. As will be explained in more detail with reference to FIGS. 11A, 11B, and 12, the pre-coat layer may consist of a silicon containing deposition in another embodiment of the invention.

Figure 3A:
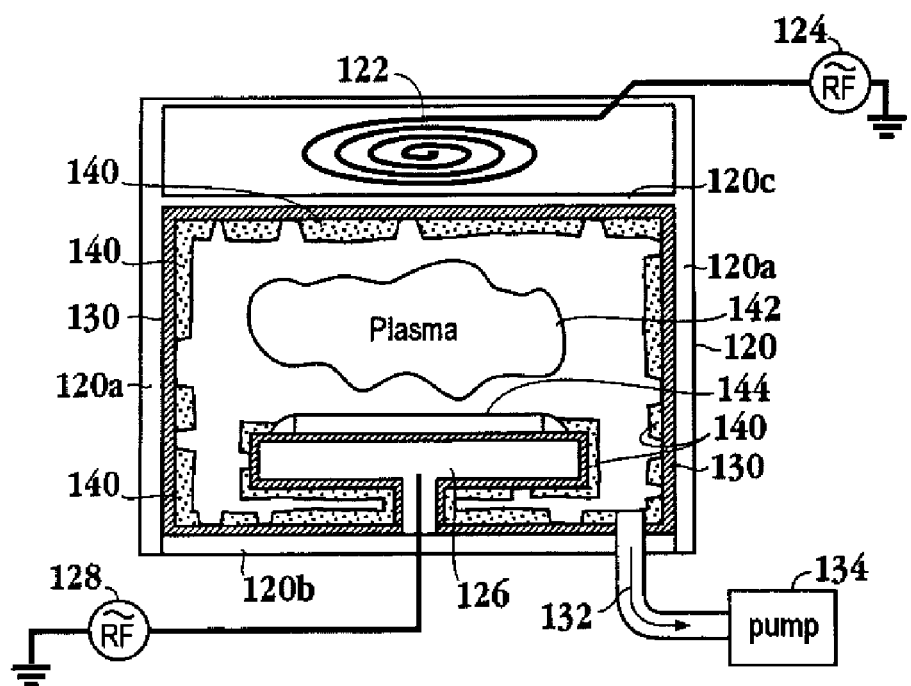
FIG. 3A is a cross-sectional schematic diagram of a semiconductor processing chamber having a residue deposited on the coating applied to the inner surfaces of the chamber in accordance with one embodiment of the invention.

FIG. 3A is a cross-sectional schematic diagram of a semiconductor processing chamber having a residue deposited on the $CF_x$ pre-coat applied to the inner surfaces of the chamber in accordance with one embodiment of the invention. Here, wafer 144 has undergone a processing operation, such as an etch or deposition operation. During the etch or deposition process plasma 142 is created inside process chamber 120. As a result of the processing operation, residue deposits 140 are formed over pre-coat layer 130. One skilled in the art will appreciate that where wafer 144 is silicon-based, silicon-based residues 144 are deposited on the inner surface of process chamber 120. Thus, the chamber walls of processing chamber 120 contain a mixture of silicon-based residues 144 on carbon and fluorine polymer pre-coat layer 130. Processing chamber 120 can now be cleaned with an oxygen ($O_2$) plasma once the wafer has been removed as will be explained further with reference to FIG. 3B. It should be appreciated that other process by-products besides silicon can be deposited, such as tungsten, carbon, etc.

Figure 3B:
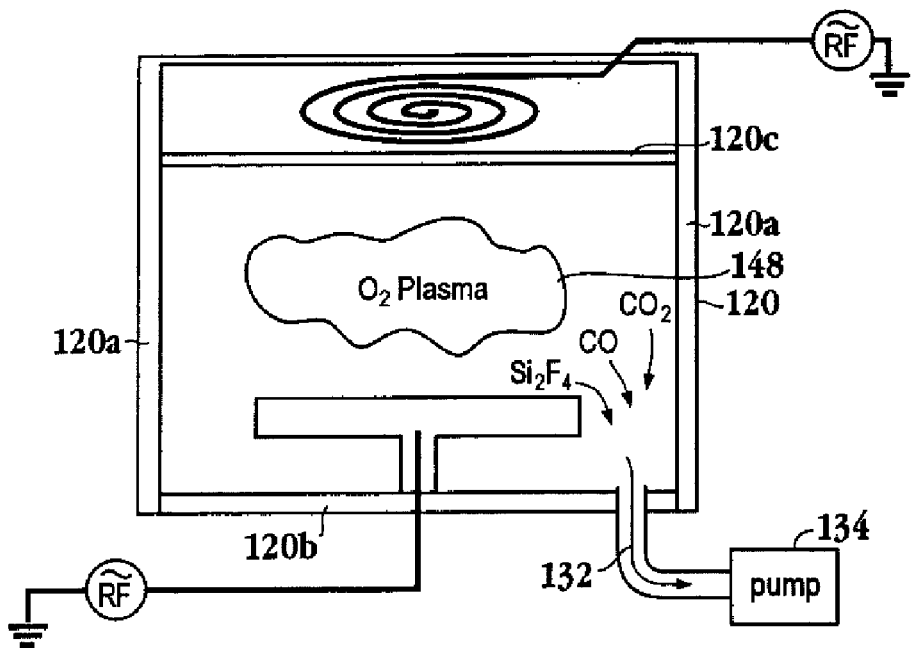
FIG. 3B is a cross-sectional schematic diagram of the semiconductor processing chamber of FIG. 3A after being subjected to an oxygen cleaning plasma in accordance with one embodiment of the invention.

FIG. 3B is a cross-sectional schematic diagram of the semiconductor processing chamber of FIG. 3A after being subjected to an oxygen cleaning plasma in accordance with one embodiment of the invention. Oxygen plasma 148 liberates the fluorine from the $CF_x$ polymer pre-coat layer of FIG. 3A by reacting with the carbon in the polymer coating to form carbon monoxide and carbon dioxide. The free fluorine released from the reaction between $O_2$ plasma 148 and the carbon removes silicon containing residue deposits, such as silicon oxy-halides and silicon oxide, by forming volatile $SiF_x$ and $Si_xF_y$ compounds, where x and y are integers. It should be appreciated that the volatile reaction species formed when removing residue deposits 140 and $CF_x$ polymer pre-coat layer 130 are pumped out of process chamber 120 by pump 134 through outlet 132. Where layer 130 is a silicon containing pre-coat, a wafer-less auto clean (WAC) process performed as either a one step fluorine rich plasma process or a two step process may be applied to clean the inner surfaces, i.e., remove the silicon containing pre-coat layer and any deposited residues resulting from the wafer processing operation. Further details on the WAC processes that may be utilized here are contained in U.S. application Ser. No. 10/139,042 entitled "Plasma Cleaning of Deposition Chamber Using Duo Step Wafer-less Auto Clean Method," filed on May 3, 2002, and U.S. application Ser. No. 10/138,288 entitled "High Pressure Wafer-less Auto Clean Method for etch Applications," filed on May 2, 2002. Both of these applications are hereby incorporated by reference for all purposes. Additionally, one skilled in the art will appreciate that the embodiments of FIGS. 3A and 3B apply to inductively coupled, capacitively coupled process chambers, microwave discharges, electron cyclotron resonance (ECR), and helicon resonator discharges.

In one embodiment, the cycle defined by the deposition of the pre-coat layer prior to processing a wafer and the subsequent cleaning of the chamber after the processing, occurs for each wafer being processed. Thus, the chamber state is substantially the same for each wafer. In turn, drifts due to degradation and erosion of the chamber parts are substantially eliminated since each wafer sees the same chamber environment, i.e., walls covered by pre-coat layer. In addition, the attack of chamber parts by aggressive etch chemistries and the particulate and metal contamination of wafers from chamber materials are both minimized because of the pre-coat layer applied to the inner surfaces of the processing chamber. That is, the pre-coat layer not only provides a consistent chamber environment for each wafer, but also provides contamination protection for the wafers and protection for the chamber parts. Accordingly, the mean time between wet cleaning operations is extended, thereby allowing for continuous running of the equipment for longer periods in between wet cleaning operations.

Figure 4:
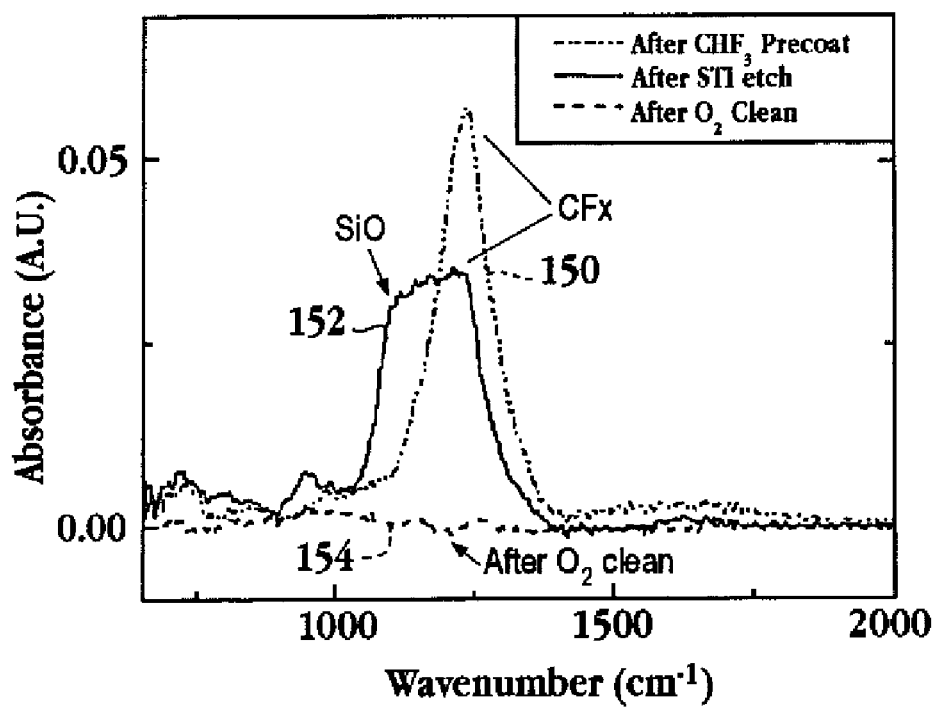
FIG. 4 is a graph comparing the absorbance of a coating after deposition of the coating, after performing the processing operation and after a wafer-less cleaning operation in accordance with one embodiment of the invention.

FIG. 4 is a graph comparing the absorbance of a $CF_x$ polymer pre-coat after deposition of the coating, after performing the processing operation and after a wafer-less cleaning operation in accordance with one embodiment of the invention. The monitoring was performed by attenuated total internal reflection Fourier transform infrared (ATIR-FTIR) spectroscopy. As is known in the art, ATIR-FTIR is used to detect deposition on a ZnSe crystal located on a chamber wall. The deposition of the etch products appears in the ATIR-FTIR signal as absorbance of the infrared (IR) beam at silicon oxide stretches (1020-1270 $cm^{-1}$) and $CF_x$ absorbance (110-1400 $cm^{-1}$). Line 150 represents the absorbance due to the $CF_x$ polymer pre-coat deposited after exposing a clean chamber to $CHF_3$ plasma. Subsequent etching of a hard mask STI wafer in the process chamber with chlorine $Cl_2/O_2$ chemistry leads to deposition of silicon containing material on the chamber wall along with some removal of the polymer pre-coat layer.

Still referring to FIG. 4, line 152 represents the absorbance due to the deposition of the silicon containing material, i.e., silicon oxy-halides ($SiO_xF_yCl_zBr_n$) and silicon oxide ($SiO_2$), and the removal of some of the $CF_x$ polymer pre-coat after the etching operation. That is, a processing operation deposits SiO-containing residue and at the same time a portion of the polymer coating is removed. Upon completion of the STI process operation, a wafer-less auto clean is performed where an oxygen ($O_2$) plasma is created in the chamber. The oxygen plasma reacts with the carbon of the polymer coating and as a result, fluorine is released from the $CF_x$ pre-coat layer. The released fluorine reacts with the silicon oxide containing deposit to form volatile compounds that are removed. Line 154 represents a baseline reading after the oxygen plasma cleaning. It should be appreciated that each wafer will see the same chamber environment when the above described process is performed and the pre-coat is re-applied. That is, the chamber environment is returned to a baseline level through the application of a pre-coat to the inner surfaces after each $O_2$ plasma cleaning operation.

Thus, both the carbon based pre-coat deposits and the silicon based etch byproduct deposits are removed by the introduction of the $O_2$ plasma. The deposits are removed by the reactions described above where volatile compounds are formed and simultaneously pumped out of the chamber through an outlet in communication with a suitable pump. For example, silicon deposits forms silicon tetrafluoride ($SiF_4$), tungsten forms Tungsten hexafluoride ($WF_6$), carbon forms carbon tetrafluoride ($CF_4$) as well as carbon dioxide ($CO_2$), all of which are pumped out of the chamber. In one embodiment, the endpoint of the $O_2$ plasma clean operation can be determined by monitoring the 516.5 nanometer line, i.e., diatomic carbon ($C_2$) emission.

Figure 5:
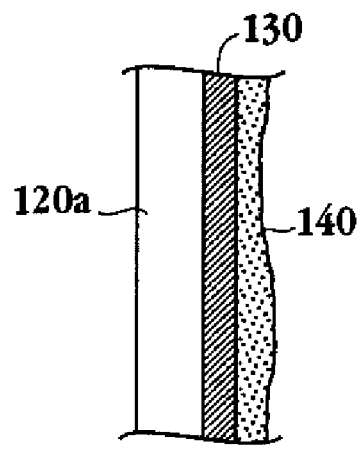
FIG. 5 is a partial, enlarged schematic diagram of the sidewall of the process chamber of FIG. 3A in accordance with one embodiment of the invention.

FIG. 5 is a partial, enlarged schematic diagram of the sidewall of the process chamber of FIG. 3A in accordance with one embodiment of the invention. Here, chamber sidewall 120a has $CF_x$ polymer coating 130 disposed over the interior surface of the sidewall. After a processing operation, such as an etch or deposition operation, residue deposits 140 are disposed over the interior surface of pre-coat layer 130. It should be appreciated that residue deposits 140 are porous, and additionally not necessarily uniformly distributed or continuous. In one embodiment, a thickness of pre-coat layer 130 is less than 500 angstroms (Å). In another embodiment, the thickness of polymer coating 130 is less than 200 Å. In a preferred embodiment, the thickness of polymer coating 130 is between about 0 Å and about 50 Å. It should be appreciated that the top, base and sidewall of the process chamber can be constructed from any material suitable for the semiconductor process operations, such as aluminum, ceramic, aluminum coated with ceramic, aluminum coated with silicon carbide, and aluminum coated with yttrium oxide.

Figure 6:
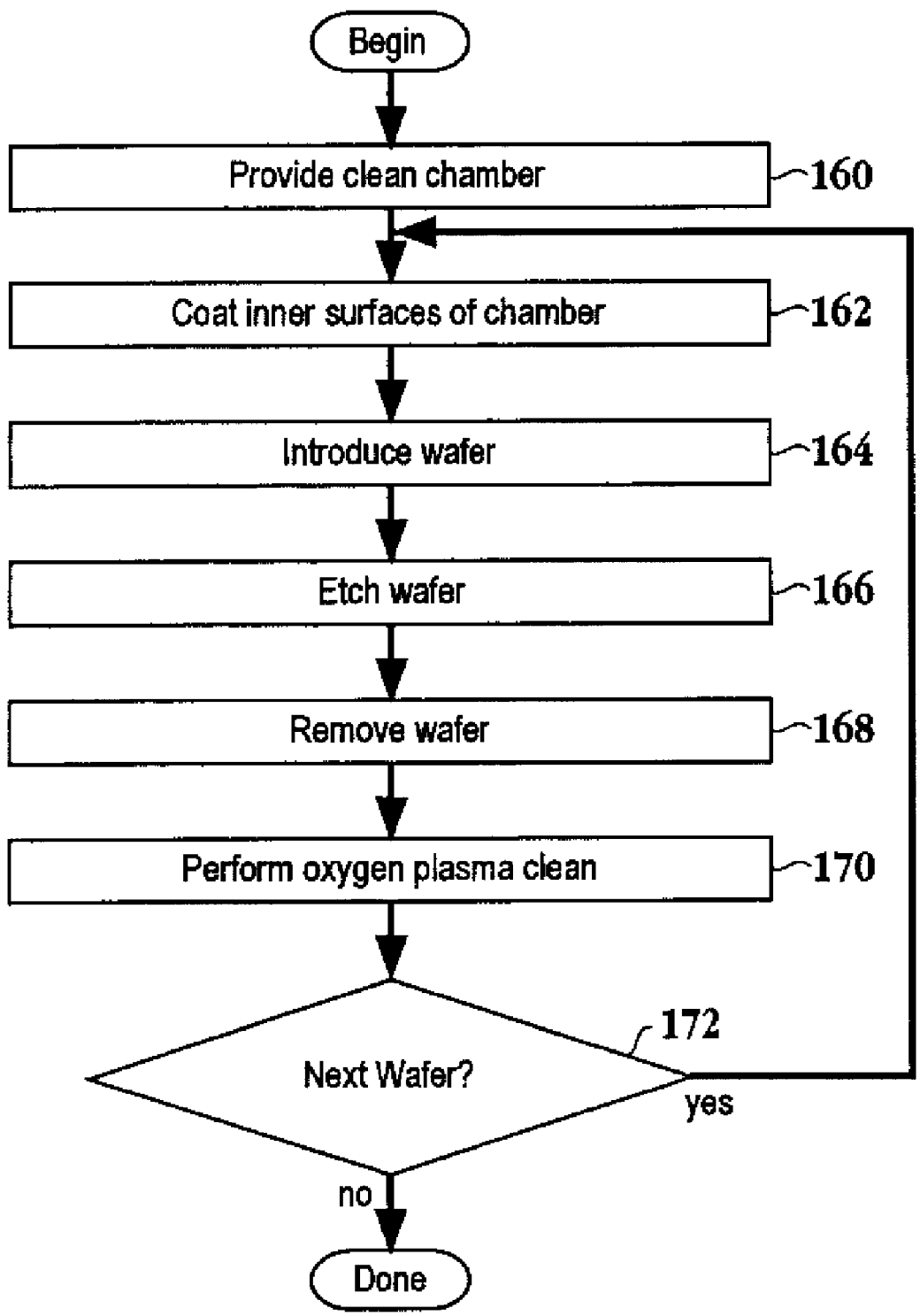
FIG. 6 is a flowchart diagram of the method operations for removing chamber deposits in between process operations in a semiconductor process chamber in accordance with one embodiment of the invention.

FIG. 6 is a flowchart diagram of the method operations for removing chamber deposits in between process operations in a semiconductor process chamber in accordance with one embodiment of the invention. The method initiates with operation 160 where a clean chamber is provided. Here the chamber is in a condition to begin a processing operation, such as a deposition or etch operation. The method then advances to operation 162 where the inner surfaces of the processing chamber are coated with a pre-coat. The pre-coat has a composition of carbon and fluorine. That is, in terms of a chemical formula, the polymer pre-coat can be represented by $CF_x$. In one embodiment, a gas containing carbon and fluorine is introduced into the process chamber and a plasma is struck to deposit the $CF_x$ polymer coating. Table 1 illustrates approximate ranges for the process variables for coating the inner surfaces of the process chamber with the polymer coating when the gas containing carbon and fluorine is a mixture of $CH_2F_2$ and $CF_4$.

TABLE 1

| | Power (Watts) | | | Flow rate of | Pressure |
| --- | --- | --- | --- | --- | --- |
| | Top | Bottom | Temperature | Gases (sccm) | (milliTorr) |
| Approx.# | 800 W | 0 W | 60° C. | $CH_2F_2$-100 $CF_4$-100 | 10 |
| Wide Range | 300-1500 W | 0-50 W | 20° C.-100° C. | $CH_2F_2$-0-1000 $CF_4$-0-1000 | 1-200 |
| Middle Range | 300-1000 W | 0-30 W | 40° C.-80° C. | $CH_2F_2$-0-200 $CF_4$-0-200 | 1-100 |

Table 1 illustrates the process ranges associated with $CH_2F_2$ and $CF_4$. However, it should be appreciated that any suitable gas or combination of gases can be used to deposit the fluorine containing polymer layer that acts as a solid source of fluorine for the oxygen cleaning plasma. Suitable gas combinations include the following combinations: $CHF_3/CF_4$, $CH_2F_2/CHF_3/CF_4$, $CH_2F_2/SF_6$, $CH_2F_2/CF_4/Ar/He$, $CH_2F_2/CF_4/He$, $CH_2F_2/CF_4/Ar$, $CHF_3/CF_4/Ar/He$. In addition, the gases containing carbon and fluorine can be used individually in another embodiment, such as $C_2F_6$, $CH_2F_2$, $C_3F_8$, $C_4F_8$, $CH_3F$ and $CHF_3$. The process variables include power supplied to a top electrode and a bottom electrode, temperature inside the chamber, flow rate of gases into the chamber and pressure in the chamber.

Returning to FIG. 6, the method then proceeds to operation 164 where a wafer to be processed is introduced into the pre-coated chamber. The method then moves to operation 166 where the wafer is etched. Of course, the process operation is not limited to an etching operation. For example the operation could be a deposition operation or photoresist stripping operation. The method then advances to operation 168 where the wafer is removed from the processing chamber upon the completion of the process operation. It should be appreciated that during the processing of the wafer, chamber deposits are left on the polymer coating of the inner surfaces of the processing chamber. The method then proceeds to operation 170 where an oxygen plasma cleaning is performed. Table 2 illustrates approximate ranges for the process variables for the oxygen plasma cleaning process.

TABLE 2

|  | Top Power (Watts) | Bottom Power (Watts) | Temperature ° C. | Flow Rate (sccm) | Pressure (milliTorr) |
|---|---|---|---|---|---|
| Approx. | 800 | 0 | 60 | 200 | 15 |
| Wide range | 300-2000 W | 0 | 20-100 | 50-1000 | 1-200 |
| Middle Range | 300-1000 W | 0 | 40-80 | 50-500 | 1-50 |

Table 2 illustrates the process variables when oxygen is the gas being introduced into the processing chamber. Similar to table 1, the process variables include the top power supplied to a top electrode of the chamber, the bottom power, temperature of the chamber, flow rate of oxygen into the chamber and the pressure of the chamber. It should be appreciated that oxygen can be mixed with an inert gas such as argon and/or helium. In one embodiment, the oxygen is mixed with argon, which in turn makes the plasma more intense. Thus, the removal rate of the chamber deposits and the polymer coating can be increased. When oxygen is mixed with an inert gas, the process variables of Table 2 would be the same, while the flow rate of the inert gas is between 0 and a flow equal to the flow rate of the oxygen. It should be appreciated that the process variables of Tables 1 and 2 may vary slightly for different types of process tools as well as different geometries of the same process tools. Thus, the process ranges are exemplary and not meant to be limiting. In one embodiment the process variables are applied to TCP9400 series tools. In another embodiment the process variables are applied to 2300 series tools.

Returning to FIG. 6, the method advances to decision operation 172 where it is determined if another wafer is to be processed. If there is another wafer, then the method returns to operation 162 where the inner surfaces of the chamber are coated with the pre-coat layer and the above described processes are repeated. It should be appreciated that the chamber environment experienced by each wafer is substantially the same because of the pre-coat layer applied to the inner surfaces of the processing chamber after the oxygen plasma wafer-less auto clean. If it is determined that there is not another wafer in decision operation 172, then the method terminates.

Figure 7:
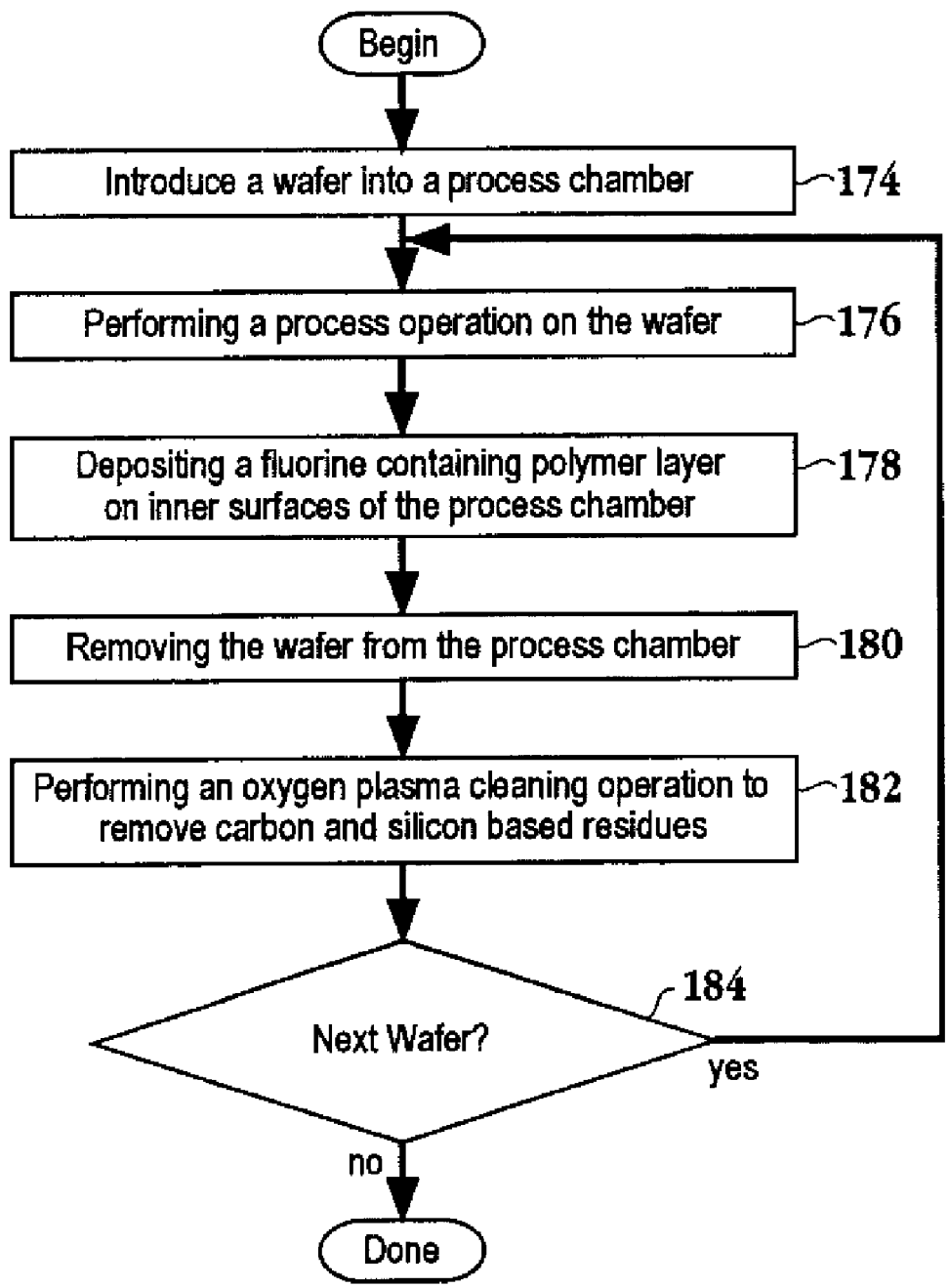
FIG. 7 is a flowchart diagram of the method operations for cleaning a process chamber to provide substantially similar starting conditions for each process operation in accordance with one embodiment of the invention.

FIG. 7 is a flowchart diagram of the method operations for cleaning a process chamber to provide substantially similar starting conditions for each process operation in accordance with one embodiment of the invention. The method initiates with operation 174 where a wafer is introduced into a processing chamber. Here, the chamber is in a condition to begin a processing operation, such as a deposition or etch operation and is in a clean state. The method then moves to operation 176 where the process operation is performed, i.e., the etch or deposition operation is performed. The method then advances to operation 178 where a fluorine containing polymer pre-coat layer is deposited on the inner surfaces of the process chamber during the processing of the wafer in this embodiment. The processing operation depositing a fluorine containing polymer layer during the processing operation include operations, such as nitride mask open, oxide mask open, and bottom anti-reflective coating (BARC) etch processes using $CH_2F_2$ as a process gas and any other etch process for a stack that uses one of the gases or gas combinations described with reference to TABLE 1.

The method of FIG. 7 then advances to operation 180 where the wafer is removed from the processing chamber upon the completion of the process operation. It should be appreciated that during the processing of the wafer, deposits other than the CFx polymer film may be formed and are left on the pre-coat layer of the inner surfaces of the processing chamber. One skilled in the art will appreciate that the inner surfaces of the processing chamber are coated in concert with the initiation of the above mentioned processes with reference to method operation 178. The method then proceeds to operation 182 where an oxygen plasma cleaning is performed. In one embodiment, the process variables described with reference to TABLE 2 are used for performing the oxygen plasma cleaning. The method then advances to decision operation 184 where it is determined if another wafer is to be processed. If there is another wafer to be processed, then the method returns to operation 176 where the process operation is performed on the next wafer and the inner surfaces of the chamber are simultaneously coated with the polymer coating upon the initiation of process operation as described above. It should be appreciated that the chamber environment experienced by each wafer is substantially the same because of the polymer coating being applied to the inner surfaces of the processing chamber upon the initiation of the process operation. If it is determined that there is not another wafer in decision operation 184, then the method terminates.

Figure 8:
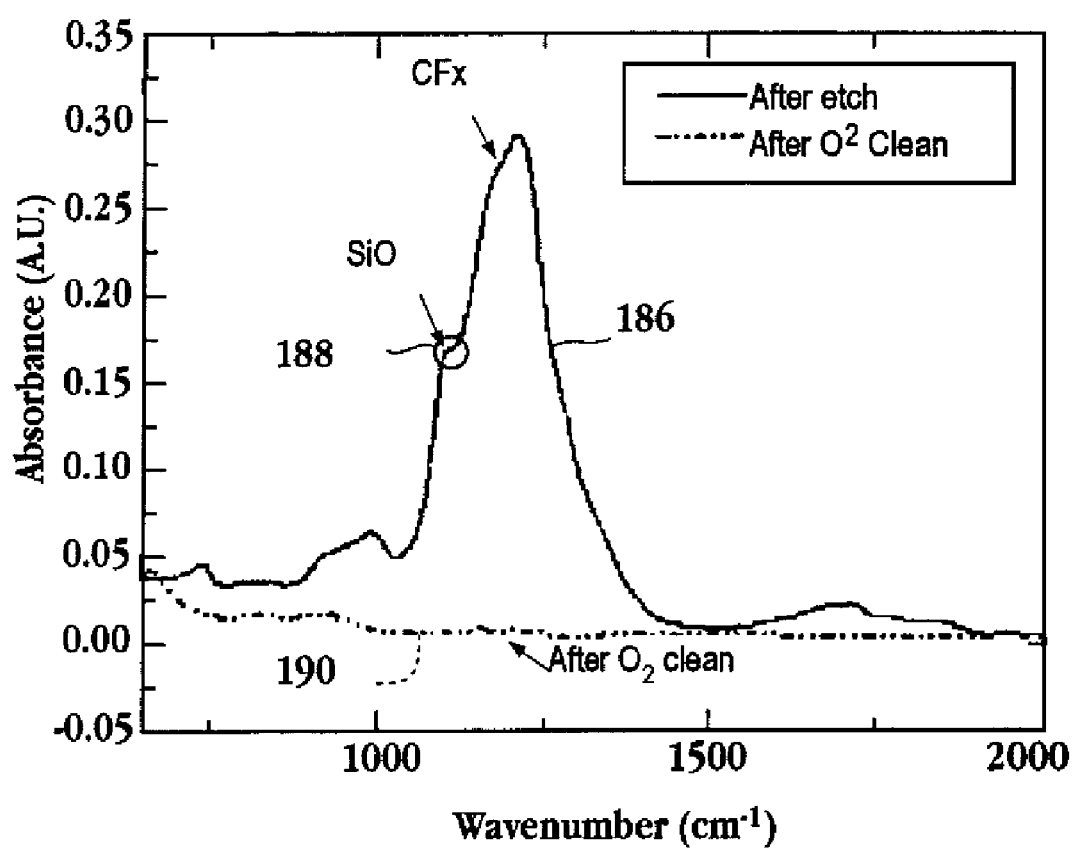
FIG. 8 is a graph of the absorbance of a coating after deposition of the coating simultaneous with an in-situ shallow trench isolation (STI) process as compared with the absorbance measured after a wafer-less oxygen plasma cleaning operation in accordance with one embodiment of the invention.

FIG. 8 is a graph of the absorbance of a $CF_x$ pre-coat layer after deposition of the coating simultaneous with an in-situ shallow trench isolation (STI) process as compared with the absorbance measured after a wafer-less oxygen plasma cleaning operation in accordance with one embodiment of the invention. Similar to FIG. 4, the monitoring for FIG. 8 was performed by attenuated total internal reflection Fourier transform infrared (ATIR-FTIR) spectroscopy. Here, a polymer coating is deposited on the inner surfaces of a chamber due to an in-situ STI process. More particularly, a nitride layer etch using $CH_2F_2$ and $CF_4$ was performed here to deposit the $CF_x$ polymer coating on the inner surfaces of the processing chamber during the processing step. Line 186 represents the absorbance after the processing operation. Region 188 of line 186 is a shoulder representing silicon oxide deposits on the inner surfaces of the processing chamber from the trench etch portion of the process.

Line 190 of FIG. 8 represents a baseline reading after the oxygen plasma cleaning. It should be appreciated that each wafer will see the same chamber environment when the solid source of fluorine is deposited on the chamber interior surfaces at the initiation of the processing operation. An oxygen plasma cleaning operation is then performed to remove the $CF_x$ pre-coat layer and the residue deposits from the processing operation, such as silicon based and carbon based deposits. That is, a substantially similar absorbance reading is obtained after each oxygen plasma cleaning when the polymer coating is deposited on the inner surfaces of the chamber upon the initiation of the processing operation. Thus, both the carbon based deposits and the silicon based deposits are removed by the introduction of the $O_2$ plasma. The deposits are removed by the reactions described above where volatile compounds are formed and simultaneously pumped out of the chamber through an outlet in communication with a suitable pump.

Figure 9:
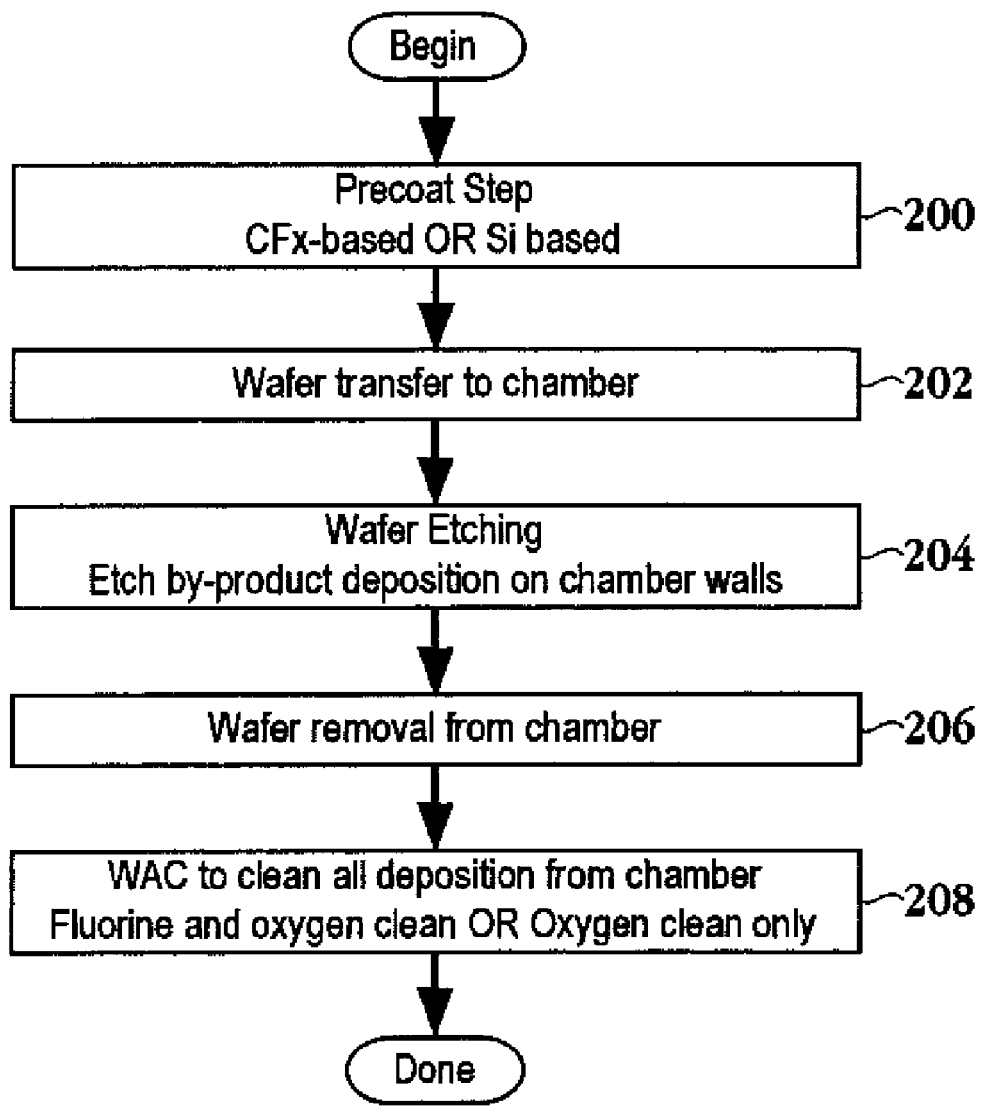
FIG. 9 is a flow chart diagram illustrating the method operations for applying the pre-coat and following with a waferless autoclean (WAC) method in accordance with one embodiment of the invention.

FIG. 9 is a flow chart diagram illustrating the method operations for applying the pre-coat and following with a wafer autoclean method in accordance with one embodiment of the invention. The method initiates with operation 200 where a $CF_x$ based pre-coat or a Silicon based pre-coat is applied to the internal surfaces of a semiconductor processing chamber. The $CF_x$ pre-coat has been described above with reference to FIGS. 3-8. In one embodiment, a silicon based pre-coat, for example, silicon oxide like film, may be applied to the internal surfaces of a semiconductor processing chamber as will be described below. A silicon containing pre-coat is achieved with plasmas containing mixtures of silicon containing feed gas, oxygen, nitrogen, and inert gases (such as Helium, Argon, etc.). The method then advances to operation 202 where a wafer is transferred through the chamber. Here, the chamber has been pre-coated with either a $CF_x$ or a Silicon based pre-coat.

The method of FIG. 9 then proceeds to operation 204 where wafer etching is executed. It should be appreciated that the execution of the wafer etching results in etch by-product deposition on the chamber walls. The byproduct deposition may include any silicon or carbon based by-products encountered during etching operations. The method then moves to operation 206 where the wafer is removed from the processing chamber upon completion of the etching operation. At this point, the chamber walls of the processing chamber include the pre-coat layer over which the by-product residues have been deposited. The method then advances to operation 208 where a wafer autoclean (WAC) is performed to clean all deposition products from the chamber walls. Depending on the nature of the pre-coat and the nature of the by-products, a fluorine and oxygen wafer autoclean step may be performed. Alternatively, an oxygen-only wafer autoclean may be executed. As described above, with reference to FIGS. 3-8, a $CF_x$ based pre-coat preferably uses an oxygen-based plasma cleaning. However, a fluorine based plasma cleaning followed by an oxygen based plasma cleaning may be used as an alternative to the oxygen-based cleaning only. The cleaning preferences for a silicon based pre-coat are described more fully with reference to FIG. 10.

The silicon containing chamber pre-coat is achieved with plasmas containing mixtures of silicon containing feed gas, with oxygen and/or nitrogen. Inert gases, e.g., helium and argon may also be added to the gas mixture. Exemplary silicon containing feed gases include: $SiH_4$, $Si_2H_6$, $SiH_3CH_3$, $Si(CH_3)_3$, $SiF_4$, $SiCl_4$, $SiHCl_3$, $SiH_2Cl_2$, $SiBr_4$ and tetraethyl orthosilicate (TEOS). The silicon containing pre-coat may be represented by the formula $SiO_xN_yR_z$, where x, y, z are real numbers and R is a constituent of the silicon containing feed gas. Composition of a silicon containing pre-coat deposited using $SiCl_4$ and $O_2$ gases may be represented by $SiO_xCl_z$, where x is a real number between 0 and 2. An exemplary range of the processing parameters for applying the silicon containing pre-coat generated from a $SiCl_4$ and $O_2$ is listed in Table 3.

TABLE 3

| | Top Power (Watts) | Bottom Power (Watts) | Flow Rate $SiCl_4$ (sccm) | Flow Rate $O_2$ (sccm) | Pressure (milliTorr) |
| --- | --- | --- | --- | --- | --- |
| Approx. | 800 | 0 | 50 | 200 | 10 |
| Wide range | 300-2000 W | 0-50 | 10-800 | 50-2000 | 1-200 |

TABLE 3-continued

| | Top Power (Watts) | Bottom Power (Watts) | Flow Rate $SiCl_4$ (sccm) | Flow Rate $O_2$ (sccm) | Pressure (milliTorr) |
| --- | --- | --- | --- | --- | --- |
| Middle Range | 300-1000 W | 0-30 | 30-300 | 50-600 | 1-50 |

Figure 10:
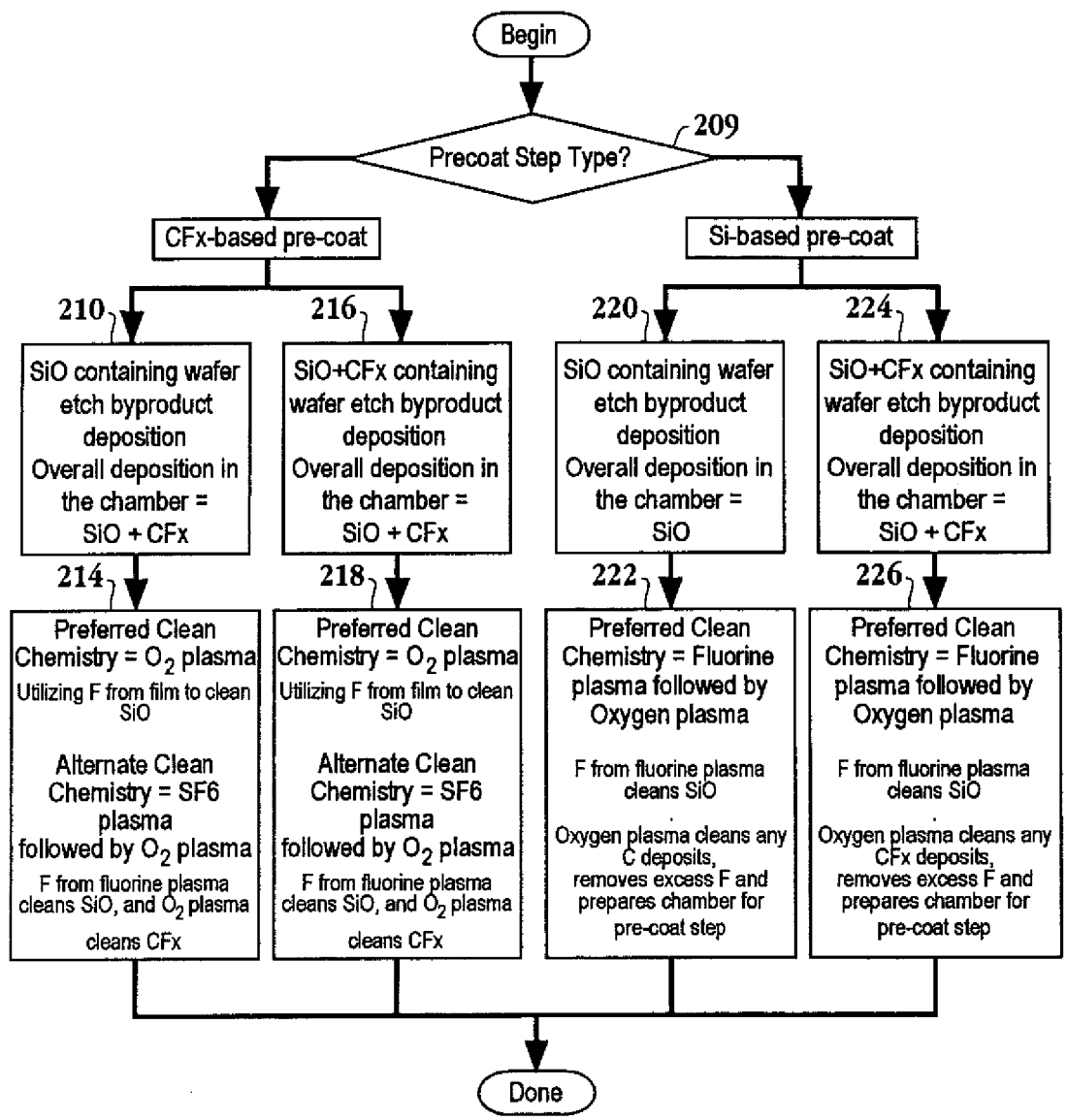
FIG. 10 is a flow chart diagram illustrating the various cleaning chemistries applied to a CFx based pre-coat and an Silicon based pre-coat in accordance with one embodiment of the invention.

FIG. 10 is a flow chart diagram illustrating the various cleaning chemistries applied to a CFx based pre-coat and a SiO based pre-coat in accordance with one embodiment of the invention. The flow chart diagram initiates with decision operation 210 where it is determined what type of pre-coat step was used. As discussed above with reference to FIG. 9, a CFx based pre-coat or a silicon-containing pre-coat may be used. The etch byproducts deposited in the chamber depend on both the nature of the wafer processed and the process chemistry used and typically consist of either silicon-oxy-halide deposits or a combination of silicon-oxy-halides with $CF_x$ deposits. Where the pre-coat is a CFx based pre-coat, the overall deposition in the chamber following a wafer etch process results in silicon-oxy-halide and $CF_x$ deposition residues on the inner walls of the chamber as illustrated in boxes 210 and 216. For the $CF_x$ based pre-coat, the preferred cleaning chemistry is an oxygen plasma which utilizes fluorine from the deposition film to clean silicon oxide as discussed above with reference to FIGS. 3A through 8. Alternatively, a cleaning chemistry consisting of a fluorine-based plasma followed by an oxygen-based plasma may be used to clean the inner surfaces of the processing chamber following a wafer etch process as illustrated in boxes 214 and 218. It should be appreciated that the fluorine from the fluorine plasma will clean silicon-oxy-halide residues and the oxygen plasma will clean carbon based residues such as $CF_x$ deposition residues.

With respect to a silicon-based pre-coat, such as SiO pre-coat, the by-product deposition is dependent on the type of wafer etch performed. For example, during silicon and poly-Si wafer etching with halogen containing plasmas, silicon-oxy-halide residues are deposited on the inner surfaces of the chamber, while silicon oxide and silicon nitride wafer etching with fluorocarbon and halogen chemistries results in the deposition of silicon-oxy-halide and $CF_x$ residues as illustrated in boxes 220 and 224, respectively. The cleaning method applied to the inner chamber surfaces after the wafer etch process includes a fluorine plasma followed by an oxygen plasma cleaning. As illustrated in boxes 222 and 226 the fluorine from the fluorine plasma cleans silicon oxide, while the oxygen plasma is directed to clean carbon-based deposits and also removes excess fluorine deposited on the chamber inner surfaces in order to prepare the chamber for a pre-coat step as discussed with reference to FIG. 9. In one embodiment, the pressure of the chamber during the cleaning/clearing of the pre-coat, e.g., fluorine plasma cleaning, is greater than 50 mT. In another embodiment the pressure is about 250 mT.

Figure 11A:
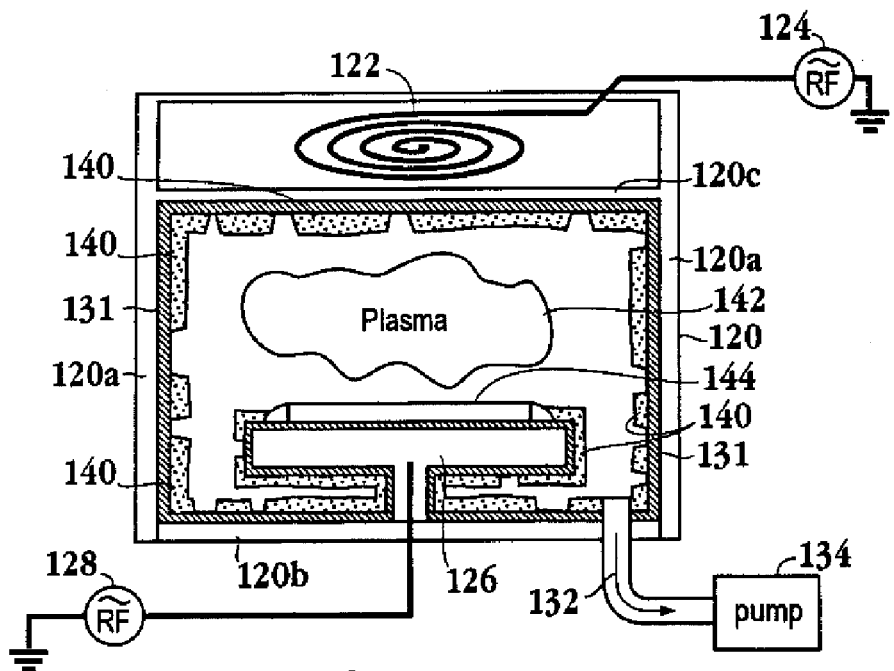
FIG. 11A is a cross-sectional schematic diagram of a semiconductor processing chamber having a residue deposited on a silicon based coating applied to the inner surfaces of the chamber in accordance with one embodiment of the invention.

FIG. 11A is a cross-sectional schematic diagram of a semiconductor processing chamber having a residue deposited on a silicon based pre-coat applied to the inner surfaces of the chamber in accordance with one embodiment of the invention. Here, wafer 144 has undergone a processing operation, such as an etch or deposition operation. During the etch or deposition process, plasma 142 is created inside process chamber 120. As a result of the processing operation, residue deposits 140 are formed over silicon pre-coat layer 131. One skilled in the art will appreciate that where wafer 144 is silicon-based, silicon-based residues 140 are deposited on the inner surface of process chamber 120. Thus, the chamber walls of processing chamber 120 contain a mixture of silicon-based residues 140 on silicon based pre-coat layer 131. Processing chamber 120 can now be cleaned with a fluorine plasma followed by an oxygen ($O_2$) plasma once the wafer has been removed as will be explained further with reference to FIG. 11B. It should be appreciated that other contaminants besides silicon may be deposited, such as tungsten, carbon, etc., as a result of the processing operation.

Figure 11B:
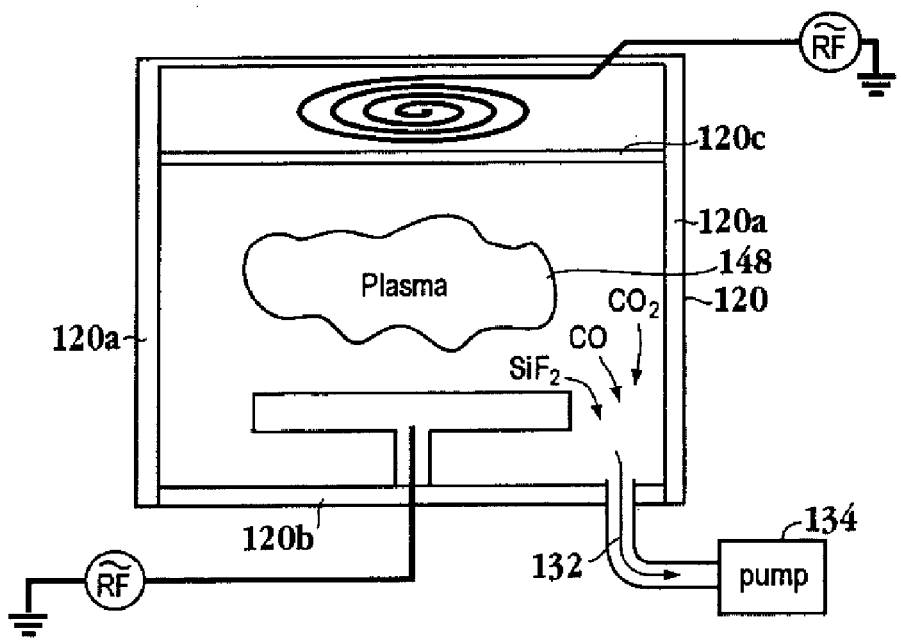
FIG. 11B is a cross-sectional schematic diagram of the semiconductor processing chamber of FIG. 11A after being subjected to fluorine cleaning plasma followed by an oxygen cleaning plasma in accordance with one embodiment of the invention.

FIG. 11B is a cross-sectional schematic diagram of the semiconductor processing chamber of FIG. 11A after being subjected to fluorine cleaning plasma followed by an oxygen cleaning plasma in accordance with one embodiment of the invention. The fluorine containing plasma removes silicon based residues by forming volatile SiF compounds. The oxygen plasma following the fluorine plasma removes the excess fluorine from the chamber. In addition, oxygen plasma removes any carbon containing residue deposits of FIG. 11A by forming carbon monoxide and carbon dioxide. Furthermore, the free fluorine released from the reaction between oxygen plasma and the carbon may assist in removing silicon containing residue deposits, such as silicon oxy-halides and silicon oxide, by forming volatile $SiF_x$ and $Si_xF_y$ compounds, where x and y are integers. It should be appreciated that the volatile reaction species formed when removing residue deposits 140 and pre-coat layer 131 are pumped out of process chamber 120 by pump 134 through outlet 132. Further details on the WAC processes that may be utilized here are contained in U.S. application Ser. No. 10/139,042 entitled "Plasma Cleaning of Deposition Chamber Using Duo Step Wafer-less Auto Clean Method," filed on May 3, 2002, and U.S. application Ser. No. 10/138,288 entitled "High Pressure Wafer-less Auto Clean Method for etch Applications," filed on May 2, 2002. Both of these applications have been incorporated by reference for all purposes. Additionally, one skilled in the art will appreciate that the embodiments of FIGS. 11A and 11B apply to inductively coupled, capacitively coupled process chambers, microwave discharges, electron cyclotron resonance (ECR), and helicon resonator discharges.

Figure 12:
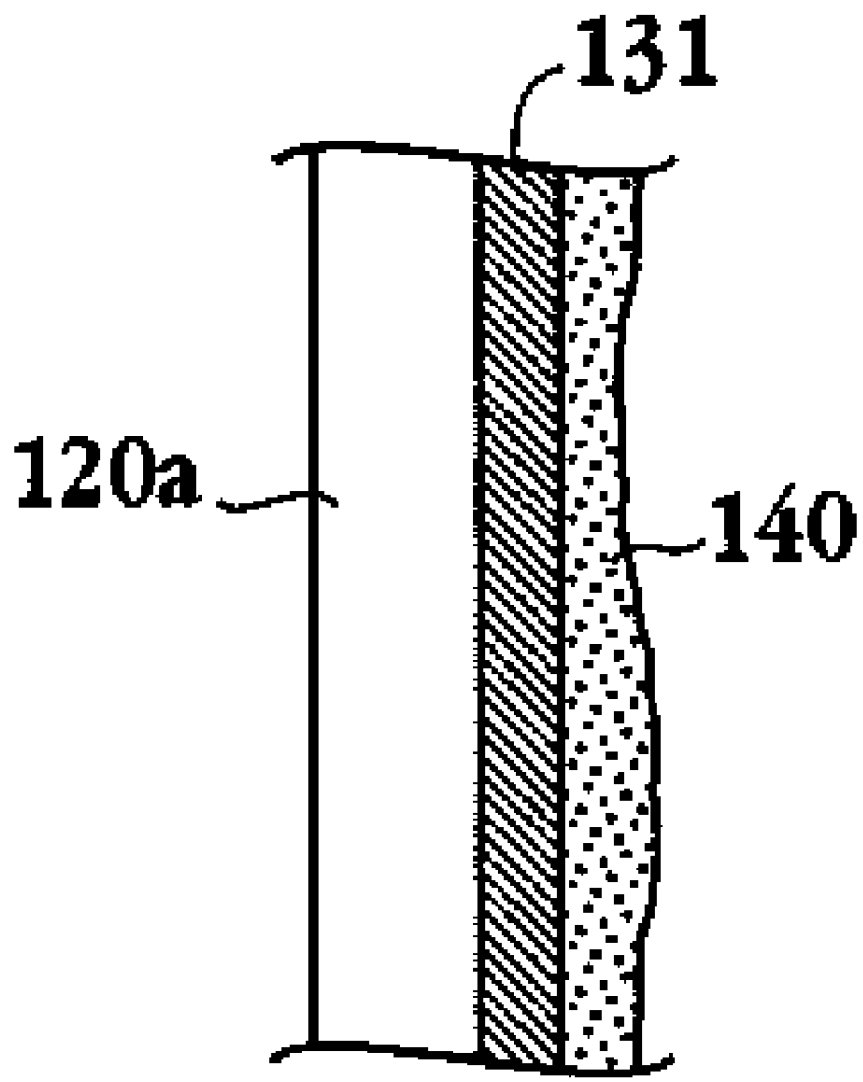
FIG. 12 is a partial, enlarged schematic diagram of the sidewall of the process chamber of FIG. 11A in accordance with one embodiment of the invention.

FIG. 12 is a partial, enlarged schematic diagram of the sidewall of the process chamber of FIG. 11A in accordance with one embodiment of the invention. Here, chamber sidewall 120a has silicon based coating 131 disposed over the interior surface of the sidewall. After a processing operation, such as an etch or deposition operation, residue deposits 140 are disposed over the interior surface of silicon based coating 131. It should be appreciated that residue deposits 140 are porous, and additionally not necessarily uniformly distributed or continuous. In one embodiment, a thickness of silicon based coating 131 is between about 50 angstroms (Å) and about 4000 Å. It should be appreciated that the top, base, and sidewall of the process chamber can be constructed from any material suitable for the semiconductor process operations, such as aluminum, ceramic, aluminum coated with ceramic, aluminum coated with silicon carbide, and yttrium oxide.

In summary, a method for coating the inner surfaces of a processing chamber with a pre-coat layer of a $CF_x$ polymer coating or a silicon containing coating to provide a substantially constant chamber environment for each processing wafer is provided. The pre-coat layer may be applied prior to a processing operation or as part of the processing operation. The pre-coat layer allows each wafer to see substantially constant repeatable chamber conditions by depositing a sacrificial layer of a $CF_x$ polymer or silicon containing layer prior to or even concurrent with the processing operation. An oxygen plasma cleaning step, a fluorine plasma cleaning step, or some combination thereof, depending on the type of pre-coat and residues deposited is then sufficient to remove the pre-coat layer and any residue deposits from the processing operation. Accordingly, drifts due to chamber material aging can be substantially eliminated due to the protection provided from the aggressive process chemistries offered by either the CFx based or the silicon based pre-coat. Furthermore, contamination from chamber parts, e.g., on wafer metal contamination, can be substantially eliminated by the application of the pre-coat layer. In addition, particles contamination present on chamber walls, particles generated in the chamber due to incomplete removal of residues, and particles generated by attack of chamber materials by aggressive plasma chemistries are prevented from falling on to the wafer by the pre-coat layer as the pre-coat covers the inner surfaces of the chamber, including any particles in the chamber when wafers are processed. In one embodiment, the pre-coat layer is re-applied after each wafer is processed. In another embodiment, the pre-coat is applied between about once every wafer to about once every 25 wafers. It should be appreciated that the time to recover from wet cleans is shortened while the need to perform wet cleans becomes less frequent as a result of the application of the pre-coat layer. Additionally, drifts due to chamber material aging are substantially eliminated by the pre-coat layer which acts to preserve the chamber inner surfaces.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for semiconductor process chamber operation, comprising:

depositing a silicon containing layer over an inner surface of an empty semiconductor process chamber, the depositing including creating a plasma while flowing a silicon containing gas consisting of essentially silicon and one of bromine or chlorine into the semiconductor process chamber;

introducing a wafer into the semiconductor process chamber after depositing the silicon containing layer;

performing a process operation on the wafer, the process operation depositing a residue on the silicon containing layer covering the inner surface of the semiconductor process chamber;

removing the wafer from the semiconductor process chamber; and initiating an in-situ cleaning process upon completion of the processing operation and removal of the wafer, the initiating including:

flowing a fluorine containing gas into the semiconductor process chamber; and establishing a pressure within the semiconductor process chamber capable of allowing a plasma created from the fluorine containing gas to clear the silicon containing layer covering the inner surface of the processing chamber.

2. The method of claim 1, wherein the method operation of initiating an in-situ cleaning process upon completion of the processing operation and removal of the wafer further includes;

flowing an oxygen containing gas into the semiconductor process chamber while maintaining the pressure; and creating a plasma from the oxygen containing gas to remove carbon based byproducts deposited on the silicon containing layer.

3. The method of claim 1, wherein the process operation is selected from the group consisting of an silicon etch operation, polysilicon etch operation, mask open operation, via etch, contact etch, aluminum metal etch, tungsten etch back, and metal gate etch.

4. The method of claim 1, wherein the pressure is about 250 milliTorr (mT).

5. The method of claim 1, wherein the fluorine containing gas includes oxygen for removal of carbon based byproducts.

6. The method of claim 1 further including:

defining process parameters including a temperature of the processing chamber, a power applied to a transformer coupled plasma (TCP) coil, and a flow rate of the fluorine containing gaseous mixture.

7. The method of claim 6, wherein the temperature is about 60° C., the power is about 800 watts, and the flow rate is between about 100 and about 500 standard cubic centimeters per minute (sccm).

* * * * *